(12) United States Patent
Gerna et al.

(10) Patent No.: US 8,665,005 B2
(45) Date of Patent: Mar. 4, 2014

(54) PROCESS AND TEMPERATURE INSENSITIVE INVERTER

(75) Inventors: Danilo Gerna, Fino Mornasco (IT); Enrico Sacchi, Pavia (IT)

(73) Assignee: Marvell World Trade Ltd., St. Michael (BB)

( * ) Notice: Subject to any disclaimer, the term of this patent is extended or adjusted under 35 U.S.C. 154(b) by 50 days.

(21) Appl. No.: 13/310,541

(22) Filed: Dec. 2, 2011

(65) Prior Publication Data
US 2012/0139617 A1 Jun. 7, 2012

Related U.S. Application Data

(60) Provisional application No. 61/419,645, filed on Dec. 3, 2010.

(51) Int. Cl.
*G05F 1/10* (2006.01)

(52) U.S. Cl.
USPC .......................................... 327/513; 327/512

(58) Field of Classification Search
None
See application file for complete search history.

(56) References Cited

U.S. PATENT DOCUMENTS

| | | | | |
|---|---|---|---|---|
| 4,128,816 A | * | 12/1978 | Shimotsuma | 331/116 FE |
| 4,430,582 A | * | 2/1984 | Bose et al. | 326/65 |
| 4,441,825 A | * | 4/1984 | Morokawa | 368/204 |
| 4,477,737 A | * | 10/1984 | Ulmer et al. | 327/541 |
| 5,796,295 A | * | 8/1998 | Sharpe-Geisler | 327/541 |
| 6,686,792 B2 | * | 2/2004 | Nakamiya et al. | 327/535 |
| 6,803,803 B1 | * | 10/2004 | Starr et al. | 327/378 |
| 7,471,152 B2 | * | 12/2008 | Jiang et al. | 330/289 |
| 7,834,683 B2 | * | 11/2010 | Truong et al. | 327/541 |
| 8,143,963 B2 | * | 3/2012 | Lin et al. | 331/186 |
| 2008/0061893 A1 | * | 3/2008 | Lakshmikumar et al. | 331/57 |
| 2008/0084249 A1 | * | 4/2008 | Noguchi | 331/66 |
| 2009/0201067 A1 | * | 8/2009 | Haneda | 327/306 |

* cited by examiner

*Primary Examiner* — Thomas J Hiltunen (57) ABSTRACT

The transition frequency of an inverter can vary with the transconductance of its internal transistors as a function of temperature and bias level. To maintain consistent transition frequency across temperatures, and therefore reduce the phase noise variation introduced by the inverter, systems, methods, and circuits are disclosed for biasing the inverter with a temperature varying current such that the transconductance of transistors remains constant across temperatures, while maintaining the lowest possible power consumption to do so. Various embodiments can include using current sources that have proportional-to-absolute-temperature (PTAT) devices.

22 Claims, 10 Drawing Sheets

$$G_M = \frac{I_C}{\frac{KT}{q}}$$

- $I_{PTAT} \sim 1/273 * T$
- MOSs $G_M$ needs a higher slope to keep $G_M$ constant over the temperature
- Using $V_{REF} < V_{BG}$ the slope is higher than in a typical PTAT topology

PROCESS AND TEMPERATURE INSENSITIVE INVERTER

CROSS REFERENCE TO RELATED APPLICATIONS

The present disclosure claims priority to U.S. Provisional App. No. 61/419,645 for "Process and Temperature Insensitive Voltage Supply" filed Dec. 3, 2010, which is incorporated herein by reference in its entirety for all purposes.

FIELD OF USE

Particular embodiments generally relate to systems, circuits, and methods for making and operating inverters with constant transconductance ($G_M$) for inverting digital signals having reduced or limited phase noise variation regardless of operating temperature or process corner with the lowest possible power consumption.

BACKGROUND

Unless otherwise indicated herein, the approaches described in this section are not prior art to the claims in this application and are not admitted to be prior art by inclusion in this section.

Figure 1:
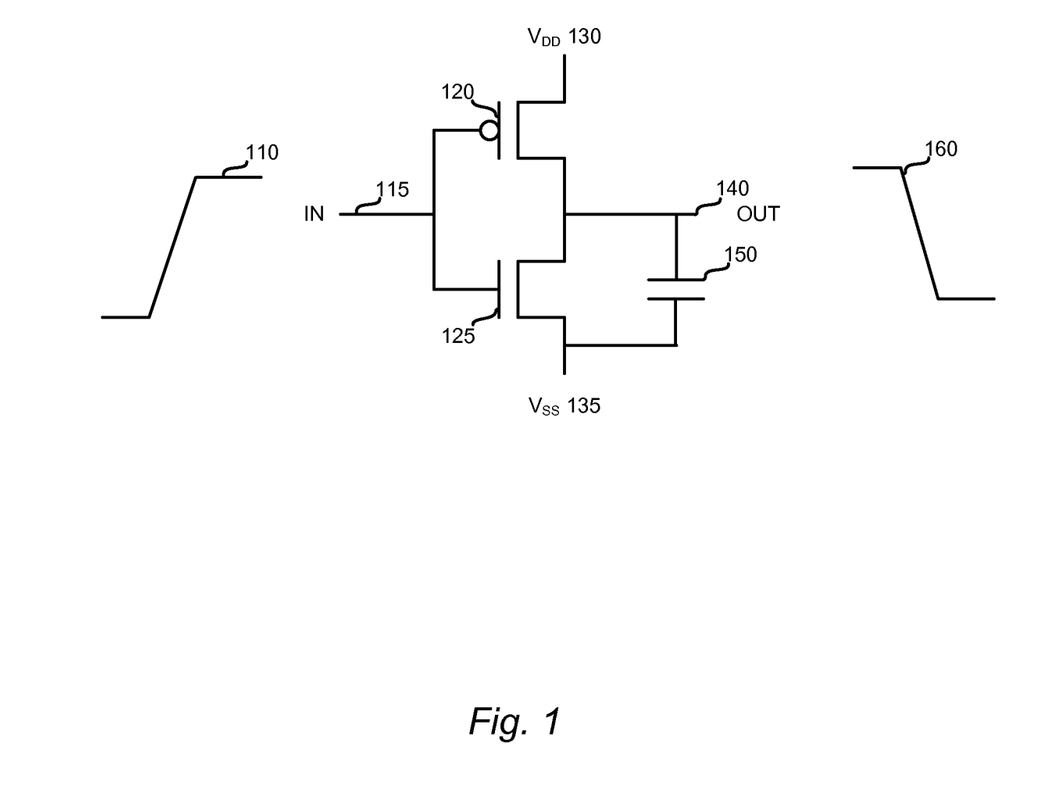
FIG. 1 is a schematic representation of a typical electronic inverter.

A schematic representation of a typical electronic inverter 100 is shown in FIG. 1. In such inverters, an incoming signal 110 having a specific frequency and form is fed into input 115 of the inverter 100. Input 115 is coupled to the gates of pMOS transistor 120 and nMOS transistor 125, as shown in FIG. 1. The pMOS 120 and nMOS 125 transistors are biased across the $V_{DD}$ drain 130 and $V_{SS}$ source 135 using a static or dynamic voltage based on a reference voltage applied at $V_{DD}$ drain 130. $V_{SS}$ source 135 can be tied to ground in some implementations. The inverted signal 160 is then output on terminal 140 that is coupled to the drain lead of pMOS transistor 120 and the drain lead of the nMOS transistor 125. The output is loaded by capacitor 150 coupled to the terminal 140 and the drain lead of the nMOS transistor 125.

The speed of electronic inverters, like inverter 100, that use MOS transistors, is dependent on the transit frequencies of the pMOS and nMOS transistors 120 and 125. The transit frequency of a MOS transistor describes the speed at which the transistor can be operated. The transit frequencies of the pMOS and nMOS transistors 120 and 125 varies with the transconductance, $G_M$, of the pMOS and nMOS transistors 120 and 125. Thus, if the $G_M$ of the pMOS and nMOS transistors 120 and 125, and consequently the transit frequencies of the pMOS and nMOS transistors 120 and 125, can be kept substantially constant over temperature and process corner variations, then the transition speed of the inverter will also remain constant, or at least within an acceptable range. When the transition speed of the inverter is constant or within an acceptable range, its contribution to overall phase noise or phase noise variation can be reduced or eliminated.

Maintaining constant transit frequencies in the pMOS and nMOS transistors 120 and 125, requires that the transistors be biased with varying voltages that corresponds to the threshold and mobility variation in the transistors due to the temperature and process corner variations in a given operating condition to maintain constant transconductance across the transistors. For example, in situations with fast-corner signals at relatively low temperature, there is no need for a high $V_{DD}$ 130 for the inverter to function a sufficiently high speeds, because the transfer frequency of the inverter will be high enough to supply a signal to other electronic components with little to no phase noise. However, in slow-corner scenarios at high temperatures, or high PT, the transfer frequency of the inverter may be too slow for high speed applications. To compensate for the relatively low transfer frequency of the inverter components, i.e. the pMOS and the nMOS devices 120 and 125, at higher temperatures, the reference voltage, $V_{DD}$, can be increased to increase the transconductance, $G_M$, of the transistors, and, consequently, the operational speed of the inverter. Ensuring that the inverter operates at speeds sufficient to keep up with frequency of the incoming signal or waveform, helps to reduce or eliminate phase noise injected into any system or device in which the inverter is used.

One fail safe method of ensuring that the inverter will always operate to transition the incoming signal at sufficiently high speeds with limited, if any, added phase noise, is to operate the inverter with a relatively high $V_{DD}$. This usually means operating the inverter with a reference voltage, $V_{DD}$, set for the worst case scenario in which the inverter would be expected to operate, i.e. the highest operating temperature. Unfortunately, this means that more power would be used for supplying the high $V_{DD}$ than is necessary for most conditions which, of course, results in higher power consumption than is necessary for most scenarios. Obviously, unnecessary high power consumption is not a desirable characteristic for most electronic devices.

Assuming linear performance of the transconductance, $G_M$, of the transistors, if an inverter can be biased with a voltage or current in the middle of a transition, then the phase noise and the rate of the transition can also be kept constant. To maintain constant $G_M$ in the inverter, the reference voltage applied to $V_{DD}$ can be varied based on simulated operation or measurement of operational parameters in actual use that can be used to adjust the reference voltage to maintain constant transition frequency and phase noise. However, contemporary systems for adjusting the $V_{DD}$ to maintain constant operation of the inverter often time require expensive active systems with computational logic, sensors and calibrated look-up tables.

SUMMARY

Embodiments of the present disclosure are directed toward apparatus that include a current source, a first transistor having a first drain lead coupled to the current source, a second transistor having a second drain lead coupled to a first source lead of the first transistor, a first gate lead of the first transistor, and a second gate lead of the second transistor. Such embodiments also include a buffer coupled to the first drain lead of the first transistor. An output current of the current source varies with temperature at a first rate that corresponds to a second rate at which a transconductance value of the first transistor and the second transistor varies with temperature to provide a circuit that is insensitive to process, voltage, and temperature (PVT) variation.

Other embodiments of the present disclosure include methods for operating a circuit, such as an inverter, to produce a digital output with limited noise and reduced power consumption. Such methods include setting a reference voltage to a first value where an output current varies with the temperature variation at a first rate at which a transconductance of a first transistor and a second transistor remains constant with the temperature variation. Setting the reference voltage can include selecting the reference voltage in response to simulated operation or experimentally derived measurements of the current source. Such methods can also include adjusting the reference voltage to a second value at which the transconductance of the first and second transistors remains constant with the temperature variation in response to the measured transconductance of the circuit.

The following detailed description and accompanying drawings provide a more detailed understanding of the nature and advantages of the present invention.

DETAILED DESCRIPTION

Described herein are techniques for circuits and methods for making and operating inverters with constant transconductance ($G_M$) for inverting digital signals having reduced or limited phase noise variation in view of operating temperature or process corner variations, while also maintaining a desired power consumption. Embodiments of the present invention are directed toward passive devices, systems and methods for sensing and adjusting the reference voltage, $V_{DD}$, to maintain constant inverter performance in view of external and internal device requirements, temperature, and incoming and outgoing signal types. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 2:
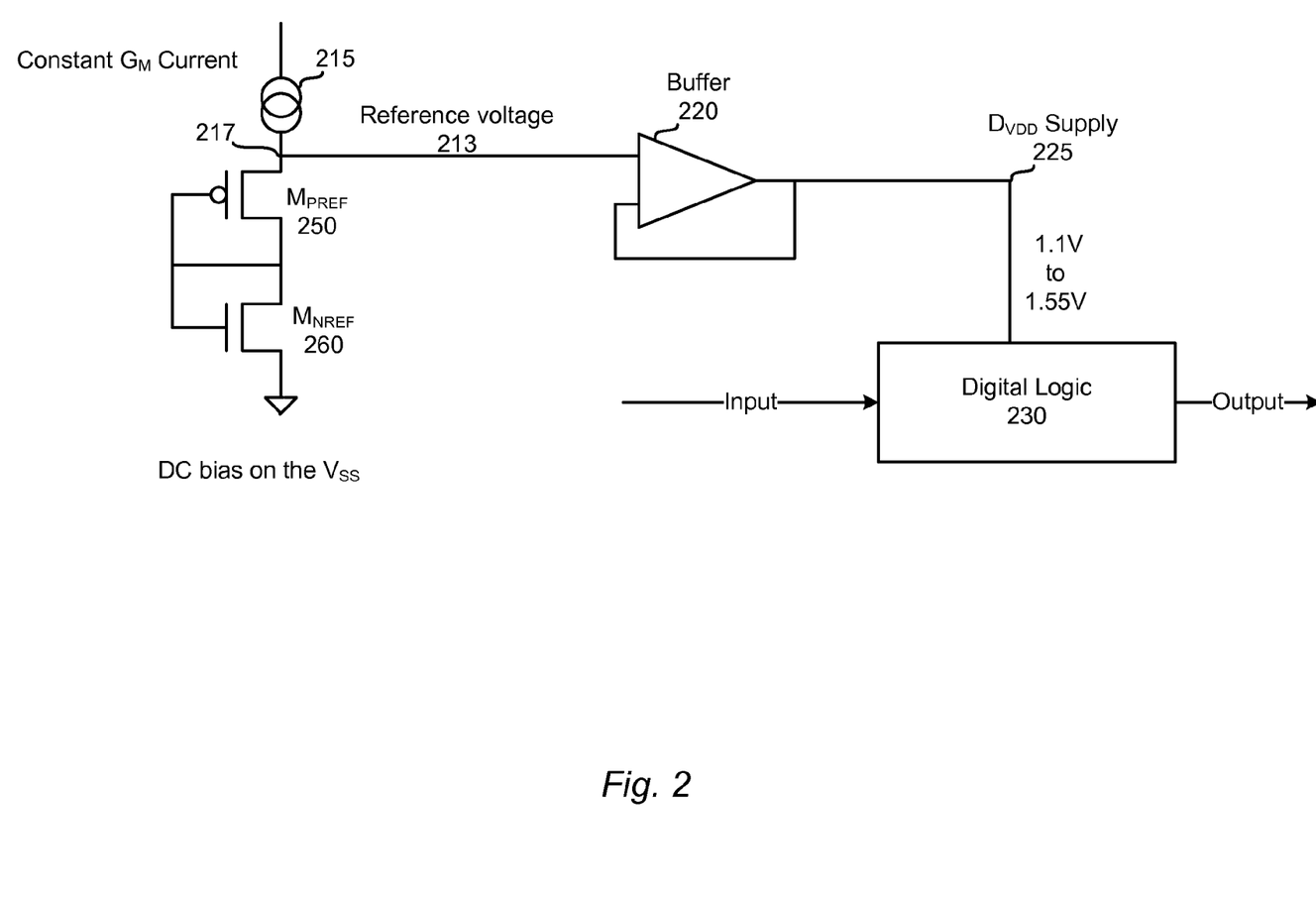
FIG. 2 is a schematic representation of an electronic invertor and the supplied device according to one embodiment.

FIG. 2 shows a schematic representation of inverter circuit 200 according to various embodiments of the present disclosure. The inverter can include a current source that can vary with temperature, such as constant $G_M$ current generator 215, coupled to MOS transistors $M_{PREF}$ 250 and $M_{NREF}$ 260 and buffer 220. As shown, the constant $G_M$ current generator 215 is coupled to the drain lead of transistor $M_{PREF}$ 250. The source lead of transistor $M_{PREF}$ 250 is coupled to the drain lead of the $M_{NREF}$ 260 and the gates of both transistors. The source lead of transistor $M_{NREF}$ 260 can be biased with a source voltage, $V_{SS}$.

In such embodiments, the inverter can be biased with a constant $G_M$ current. The constant $G_M$ current 215 refers to a current that can vary to maintain constant transconductance, $G_M$, across the pMOS and nMOS transistors, $M_{PREF}$ 250 and $M_{NREF}$ 260, regardless of variations in temperature and process corners. By maintaining constant $G_M$ in the transistors, the transit frequencies of the transistors is also kept relatively constant. Since the phase noise of the inverter is proportional to the variation in transit frequencies of the transistors, the variation in phase noise can be reduced or eliminated by using constant $G_M$ current. In some embodiments, the voltage source, $V_{SS}$, can be biased with a DC voltage to produce the required voltage drop over the transistors.

During use, as the temperature increases, the charge mobility of the transistors decrease, so that the threshold voltages of the transistors $M_{PREF}$ 250 and $M_{NREF}$ 260 also increase. Accordingly, to maintain constant transconductance, $G_M$, and consequently constant or relatively invariant transit frequencies in the transistors, the current from 215 must also increase as the temperature increases. Constant $G_M$ current is the current that produces a reference voltage 213 that can be coupled to the unity gain buffer 220 to produce a separated and inverted $D_{VDD}$ supply 225 to another digital logic 230, such as a high speed divider, with minimal phase noise.

The $M_{NREF}$ 250 and $M_{NREF}$ 260 transistors measure the voltage across the drain source due to the constant GM current. Each of the transistors are capable of 100 mV swings of the respective threshold voltage such that the voltage at the point 217 can swing by approximately 200 mV. If the gate voltage in of the pMOS transistor is held above the threshold voltage, then the voltage at 217 goes up. In the circuit 200, if the $D_{VDD}$ goes up, then, because of buffer 220, the voltage at point 217 will also go up automatically. This allows the $D_{VDD}$ supply to digital logic 230 to be precisely what the circuit needs to operate without wasting power which can result from setting the reference voltage too high for a particular digital logic 230 or operating temperature. Accordingly, the transconductance across the pMOS transistor and the nMOS transistor remains relatively constant over process, voltage and temperature variation (PVT variation) of the nMOS and pMOS used to generate the reference voltage using the constant GM current.

Figure 3:
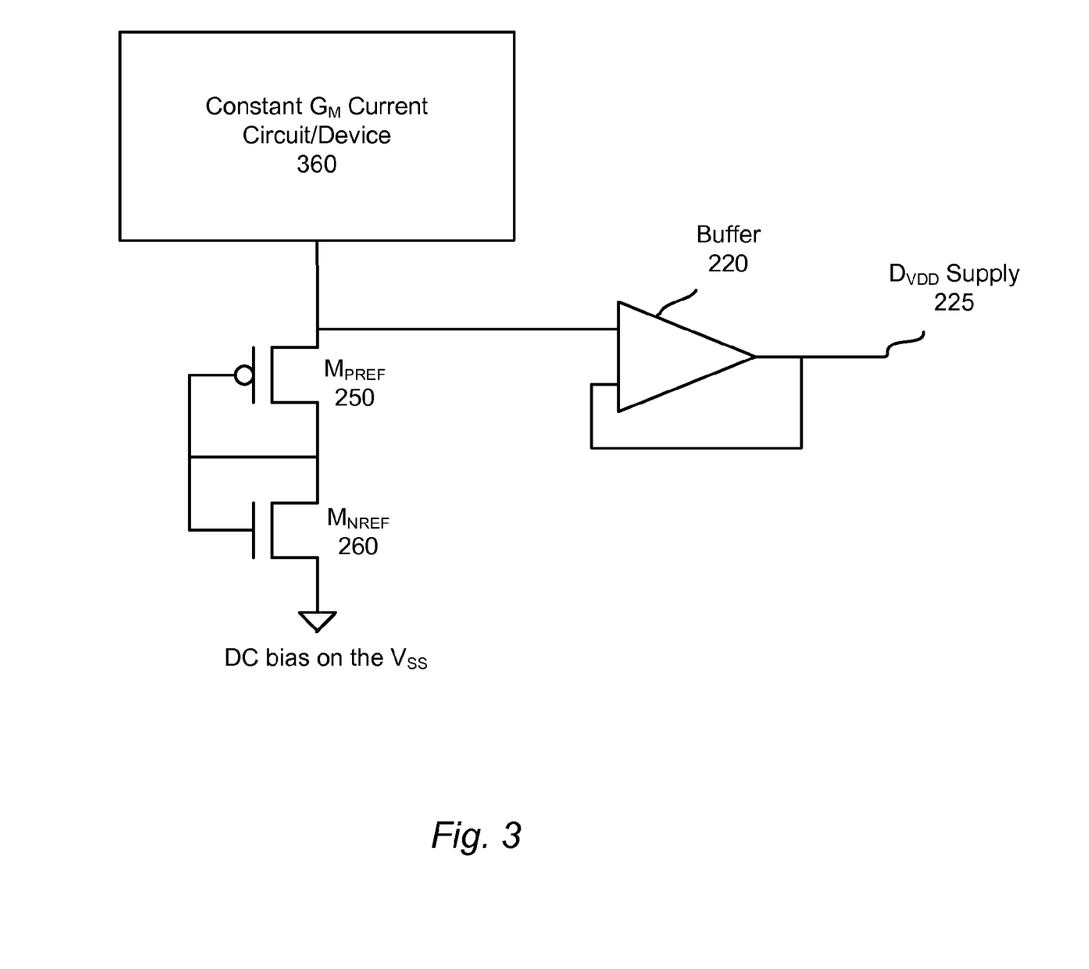
FIG. 3 is a schematic representation of a process and temperature insensitive electronic invertor according to one embodiment.

FIG. 3 shows a schematic representation of inverter circuit coupled to a constant $G_M$ current circuit/device 360, according to various embodiments of the present disclosure. As discussed above, the current used to bias the transistors 250 and 260 and the buffer 220 needs to vary with temperature and process corners to compensate for the variation in mobility and threshold voltages. Various devices can be used to implement the constant $G_M$ current circuit/device 360, including, but not limited to, the examples discussed herein in reference to FIGS. 4-8.

Figure 4:
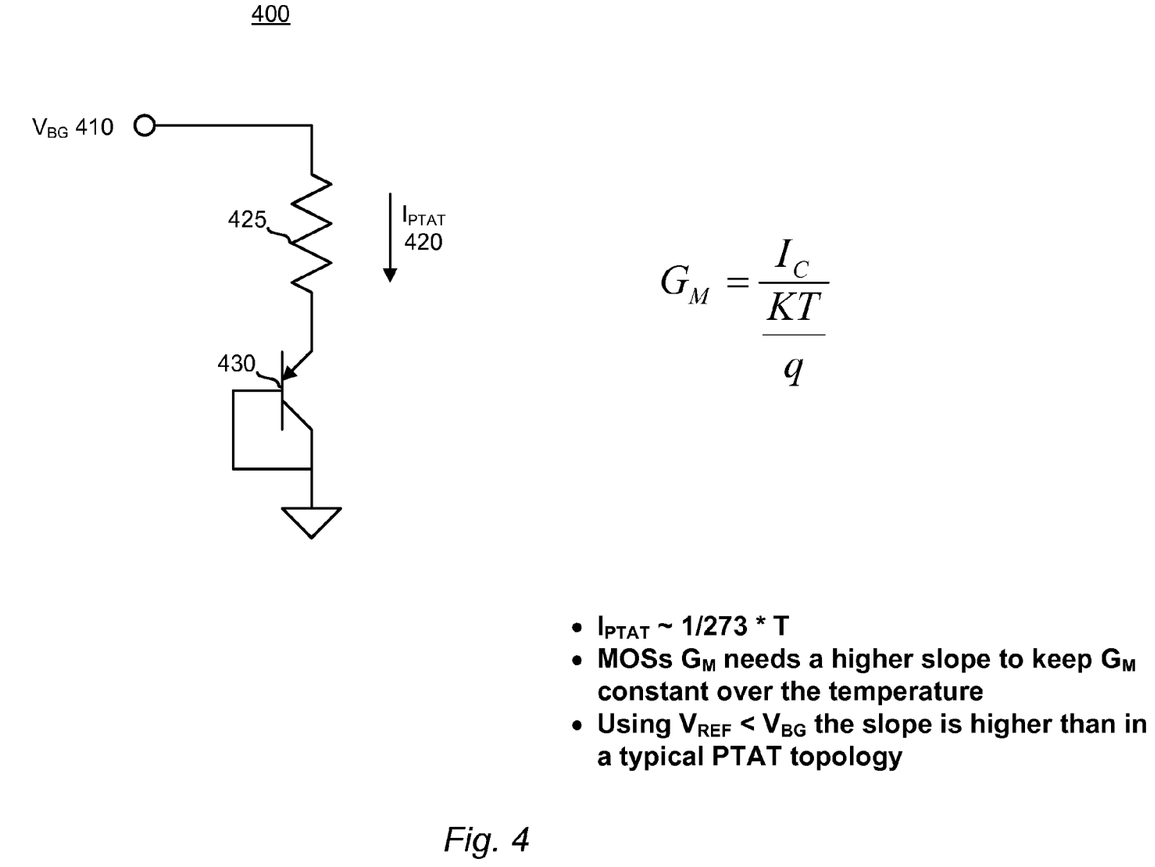
FIG. 4 is a schematic representation of a proportional-to-absolute-temperature (PTAT) circuit that can be used to implement various embodiments.

One technique for providing the varying constant $G_M$ current is to use a type of proportional-to-absolute-temperature (PTAT) circuit or device, like the one shown in FIG. 4. As shown, the PTAT can include a resistor 425 coupled to a bipolar junction transistor (BJT) 430. Resistor 425 can be tuned to a specific resistance based on analysis performed by techniques and methods described herein. In some embodiments, the resistor can be digitally tunable, while in other embodiments, the resistor is tuned by mathematical analysis or trial and error.

In PTAT type devices, the current increases with temperature. The reference voltage in a PTAT can be a bandgap voltage $V_{BG}$, of approximately 1.2V. The slope increase of current with temperature in bipolar junction transistor (BJT) devices is ~1/273.15 C. However, when using a MOS transistor, which can be approximated as a bipolar transistor in most implementations, the slope of the current versus the temperature needed to keep the transconductance, $G_M$, constant is steeper. Thus, the slope of the current versus temperature in the MOS transistor can be adjusted to provide the proper current to keep the transconductance of the MOS transistors constant.

When a voltage $V_{BG}$ is applied to the resistor 425, a current, $I_{PTAT}$, that is proportional to the temperature of the circuit, including BJT 430 and resistor 425, results in a current $I_{PTAT}$ such that $I_{PTAT}$~1/273*T, wherein T is the temperature of the circuit 400 in degrees Kelvin. It follows that as the voltage $V_{BG}$ is reduced, the rate of change of the variation of the current with temperature will decrease. This relationship between the $V_{BG}$ and the slope of $I_{PTAT}$ as a function of temperature is useful for analysis and various method embodiments of the present disclosure. As used herein, the terms slope and rate of change can be used interchangeably to refer to the relationship between the variation between two or more variable or data points.

Figure 5:
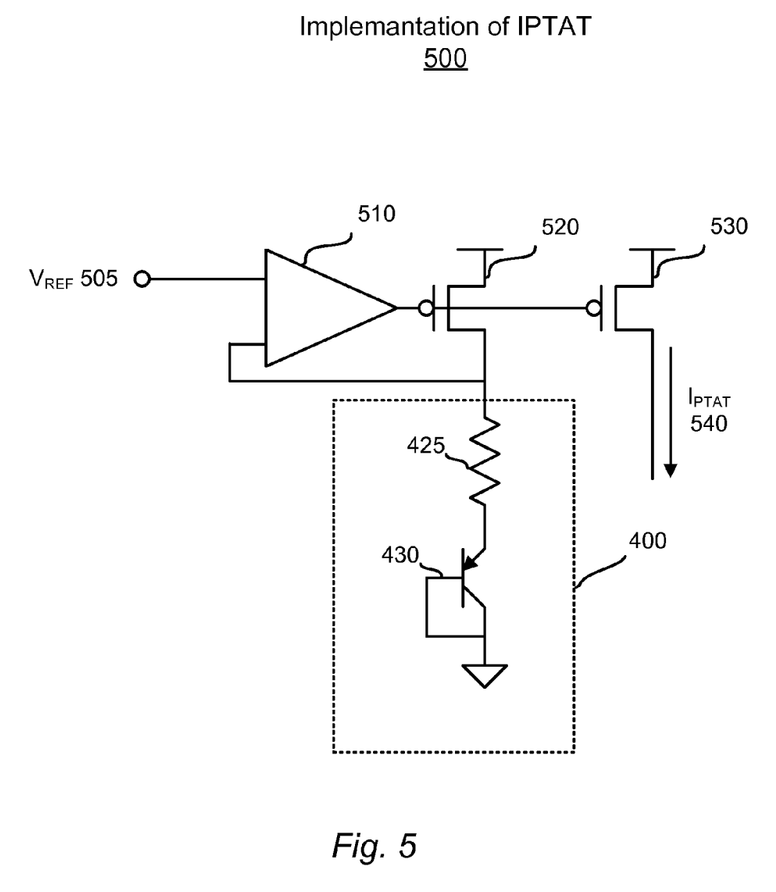
FIG. 5 is a schematic representation of a proportional-to-absolute-temperature (PTAT) circuit that can be used to implement various embodiments.

FIG. 5 shows another example of a possible $I_{PTAT}$ circuit 500 that can be used in various embodiments. As shown, the resistor 425 of circuit 400 can be coupled to one input of a buffer 510 and two pMOS transistors 520 and 530 via the source lead of transistor 520 as shown, such that when a $V_{REF}$ 505 is coupled to the other input of the buffer 510, $I_{PTAT}$ 540 varies with the temperature.

Figure 6:
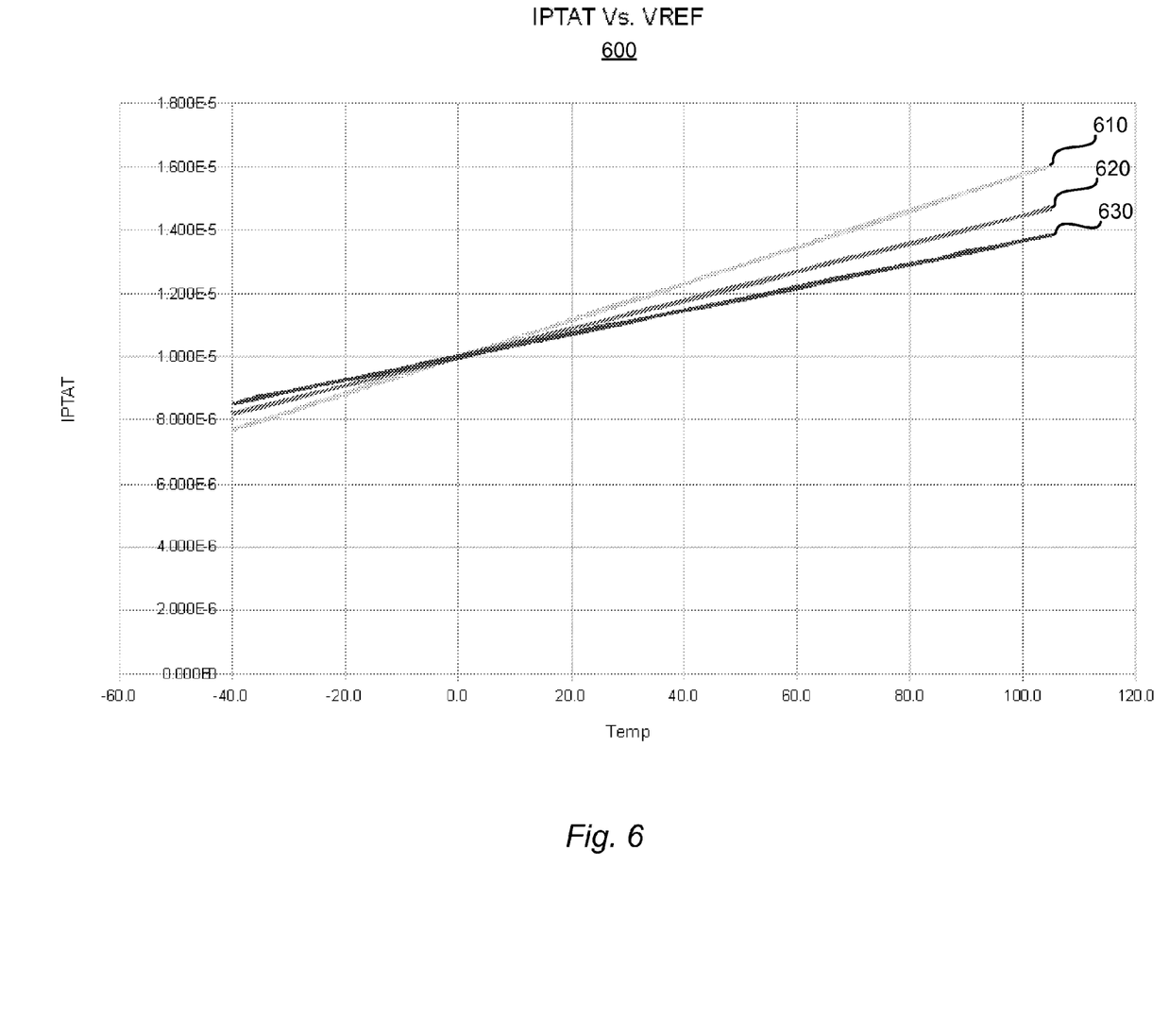
FIG. 6 is a graph of the output current from an PTAT circuit versus temperature at three reference voltages.

FIG. 6 shows a graph 600 of the output current of a representative PTAT device, $I_{PTAT}$, versus temperature with the $V_{REF}$ set to three different $V_{REF}$ voltages represented by lines 610, 620, and 630. The slope of the current, $I_{PTAT}$, versus temperature varies inversely with $V_{REF}$. Once the desired $V_{REF}$ is determined, that voltage can be held to produce the varying current needed by the MOS transistors to provide the transition performance needed in the inverter. FIG. 6 shows the results of a simulation that shows a relationship of current in the PTAT device ($I_{PTAT}$) versus the temperature at three different $V_{REF}$s. The $V_{REF}$ 610=1.2V, $V_{REF}$ 620=1.1V, and $V_{REF}$ 630=1.0V. As shown, the slope of $I_{PTAT}$ versus temperature is greater for higher $V_{REF}$ voltages.

To provide easy comparison and analysis of the $I_{PTAT}$ curves, it is convenient to have the lines intersect at some temperature, as shown in FIG. 6 where the lines intersect at 0 degree K. This indicates that the value of the resistor in the PTAT devices 400 or 500 may need to be tuned to give the same current at 0 degrees K, or some other temperature, for all three $V_{REF}$ voltages, as shown in FIG. 6, otherwise the comparison of the various slopes due to varying the $V_{REF}$ would not be meaningful. Since power consumption follows the square of the $V_{REF}$, it is advantageous to keep $V_{REF}$ as low as possible to achieve the desired performance characteristics. Embodiments of the present disclosure advantageously facilitate maintaining the lowest possible $I_{PTAT}$ necessary while reducing or eliminating the phase noise injected by the inverter.

Figure 7:
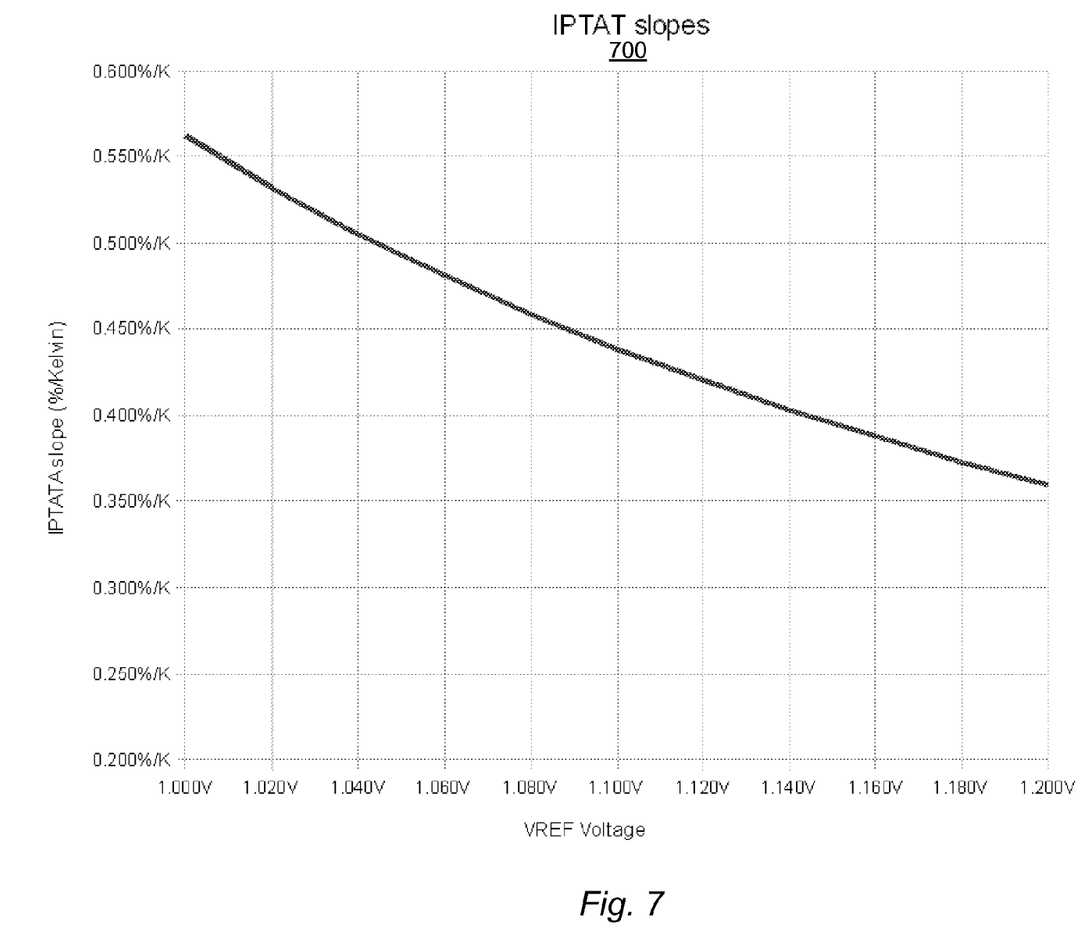
FIG. 7 graph of the linear slope of the current from an PTAT circuit with respect to the changes in temperature over a range of reference voltages.

FIG. 7 is shows a chart of the slopes of the $I_{PTAT}$ versus temperature as a function of $V_{REF}$. This chart helps visualize the correlation between $I_{PTAT}$ versus temperature as a function of $V_{REF}$. As can be seen, the slope of $I_{PTAT}$ versus temperature decreases as the $V_{REF}$ increases. Accordingly, $V_{REF}$ and a resistor value 425 can be chosen to provide a $I_{PTAT}$ current that varies with temperature to match the current needed to maintain constant GM and transition frequencies in the pMOS and nMOS transistor in the inverter so as to reduce or eliminate phase noise during the inversion process.

Figure 8:
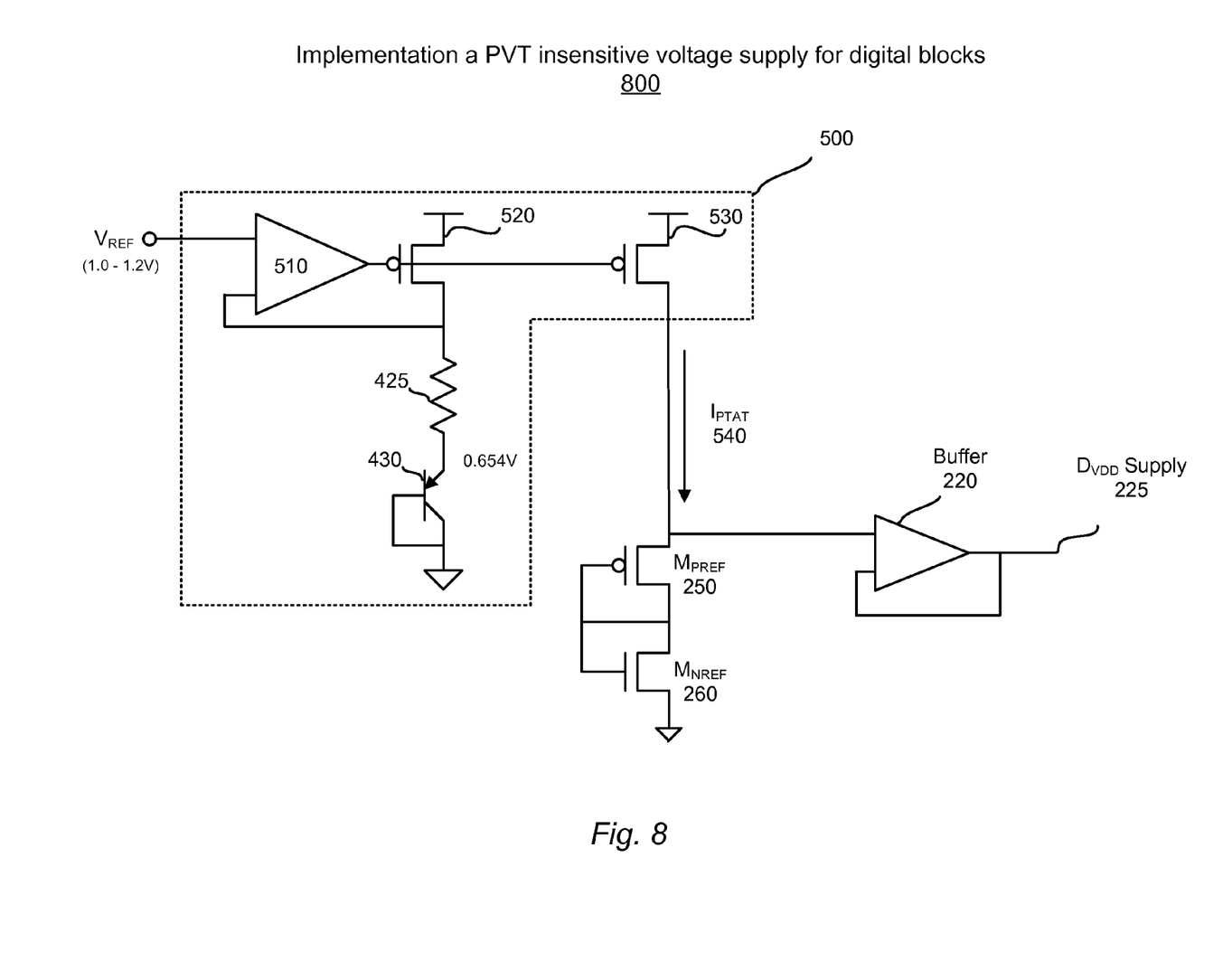
FIG. 8 is a schematic representation of a process, voltage, temperature (PVT) insensitive voltage supply that can be implemented using various embodiments.

Without PTAT devices such as those shown in FIGS. 4 and 5, it is possible to observe phase noise variation of up to 6 dB with PVT variation. The capability of embodiments such as that shown in FIG. 2 can achieve phase noise of less than 1 dB with PVT variation. Consequently, the constant $G_M$ current can vary widely. For example, at higher temperatures, where the mobility in the transistors is reduced, higher currents are needed to maintain the constant transconductance. The variation in current yields the variation in the reference voltage to the transistors, to reduce or eliminate the phase noise variation. However, since the high current is not always needed, setting the current high only when needed by the specific operating conditions, i.e. PVT, can yield significant systematic reductions in power consumption. Adjusting the slope of the current versus the temperature can be achieved using mathematical analysis, experimentation or by simulation FIG. 8 is schematic representation of a specific example of a circuit 800 that can be used to implement various embodiments. In circuit 800, circuit 500 can be used to generate the varying current $I_{PTAT}$ that will vary automatically with temperature to maintain constant transconductance, $G_M$, and transition frequency in the transistors 250 and 260. Typically, $V_{REF}$ need only be varied from 1.0V to 1.2V to produce the required performance, however other $V_{REF}$ ranges can also be helpful when dealing with extreme temperature and process corner variations.

FIG. 8 shows schematic representation of a circuit according to various embodiments. In such embodiments, a PTAT type circuit 500 can be used as the load for the buffer 220 coupled to the pMOS transistor 250. The PTAT type circuit 500 can include a BJT 430 coupled to a resistor 425. The current in the PTAT type circuit 500 will be mirrored in the current through the $M_{PREF}$ and the $M_{NREF}$ that are used to generate the voltage that is buffered by the buffer 220 that supplies the $D_{VDD}$ supply 225 for a digital circuit.

Figure 9:
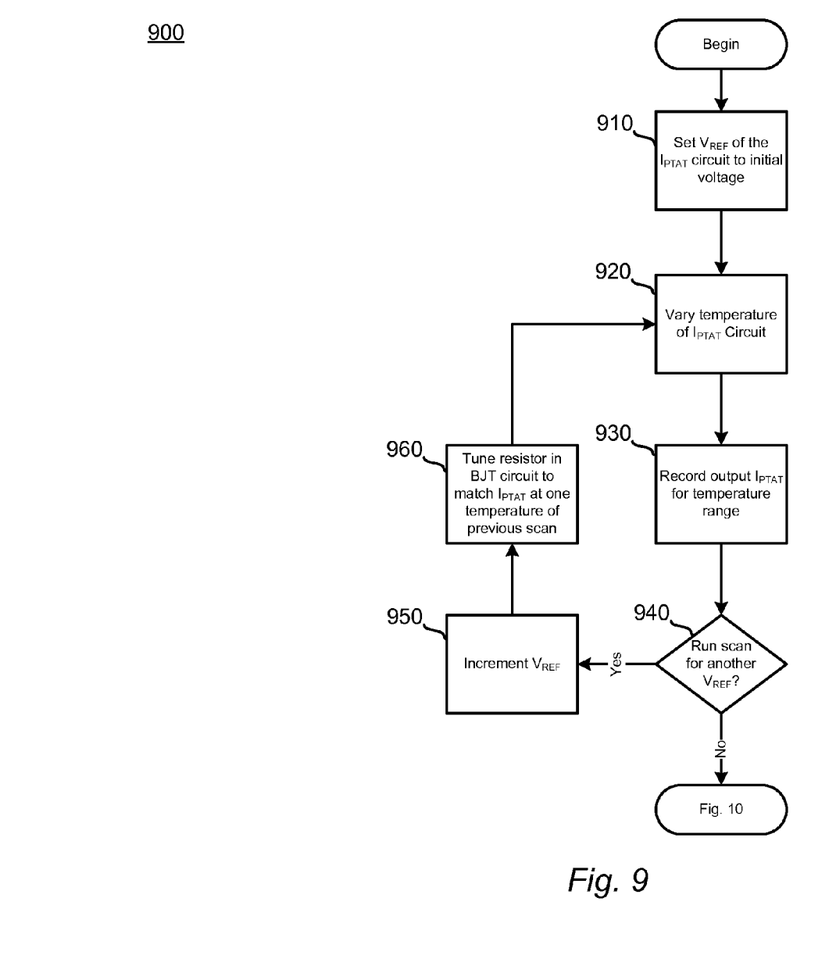
FIG. 9 is a flow chart of a method for analyzing and configuring the performance characteristics of an inverter according to various embodiments.

FIG. 9 is a flowchart of a method 900 for setting the $V_{REF}$ voltage of circuits and devices according to various embodiments to achieve the fast transition frequencies in an inverter with constant transconductance, $G_M$, and reduced or eliminate phase noise. Such methods can include a PTAT device characterization routine. For example, at 910, the $V_{REF}$ voltage of an $I_{PTAT}$ circuit can be set to an initial value. The value of the $V_{REF}$ voltage can be set high initially or low initially. Next, in 920, the temperature of the $I_{PTAT}$ circuit can be varied over some range of temperatures to determine the corresponding output $I_{PTAT}$ at each temperature point. In alternative embodiments, the temperature can be set and then the $V_{REF}$ voltages can be scanned. In either embodiment, at 930, the output of $I_{PTAT}$ can be recorded as a function of temperature and $V_{REF}$. If there are more $V_{REF}$ voltages that need to be tested, as determined at 940, the value of $V_{REF}$ voltage can be incremented, i.e. either increased or decreased at 950.

In the event that the $V_{REF}$ voltage is changed, it may be necessary to replace or tune the resistor in the $I_{PTAT}$ circuit to produce an output $I_{PTAT}$ that is equal to the output of another $V_{REF}$ voltage at a given temperature for the purpose of comparison. For example, the resistor of the $I_{PTAT}$ circuit can be tuned to scale the graphs of the various scanned $V_{REF}$ voltages so they intersect at 0 degrees Kelvin, as shown in FIG. 6. Scaling the graphs can include changing the resistance of a resistor in the $I_{PTAT}$ circuit to move the graph of the output $I_{PTAT}$ up or down, depending on the adjustment needed to have the graphs intersect at a specific temperature.

Once the appropriate resistor value is found to allow for meaningful comparison of the $V_{REF}$ voltages, then the temperatures can again be scanned and the resulting output $I_{PTAT}$ can be measured and recorded in 920 and 930. This process can continue for as many iterations as is necessary or desired to achieve the desired performance in the inverter. Once all of the desired $V_{REF}$ voltages have been scanned, the method can be passed off to the method 1000 shown in FIG. 10.

Figure 10:
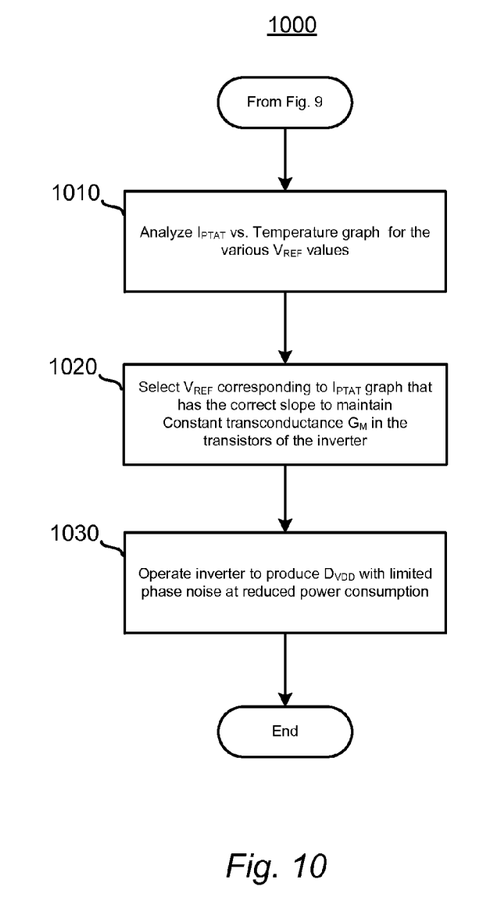
FIG. 10 is a flow chart of a method for tuning the reference voltage for a PVT insensitive inverter according to various embodiments.

FIG. 10 shows a flowchart of a method for setting the $V_{REF}$ voltage in the $I_{PTAT}$ circuit to produce the varying current necessary to maintain constant transition frequencies and transconductance in the transistors of the inverter. At 1010, the $I_{PTAT}$ versus temperature graphs for the various $V_{REF}$ voltages can be analyzed. This analysis can include examining the steepness of the slope of the $I_{PTAT}$ versus temperature graphs. In 1020, the $V_{REF}$ voltage that corresponds to the graph of $I_{PTAT}$ versus temperature with correct slope to maintain the constant $G_M$ in the transistors of the inverter can be selected. This selection can be based on the simulated or measured performance of the transistors in the inverter as a function of temperature. Finally, in 1030, the inverter can be operated with the selected $V_{REF}$ voltage to produce the $D_{VDD}$ with limited phase noise at the reduced power consumption. Embodiments of the present invention are very useful when the phase noise varies with the transconductance of the device. The $V_{DD}$ can be tuned, depending on the corner, to minimize the power consumption. Embodiments of the present disclosure can also be used in other digital topologies to sense the temperature of some other digital design. This is particularly useful in high speed circuits, but can also be used in lower speed circuit designs.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
a current source having an output current, wherein the output current varies at a first rate with a change in a temperature of the current source;
a first transistor having a source, a drain and a gate, wherein the source of the first transistor is connected to the current source;
a second transistor having a source, a drain and a gate, wherein the source of the second transistor is connected to (i) the drain and the gate of the first transistor, and (ii) the gate of the second transistor; and
a buffer connected to the source of the first transistor, wherein
a transconductance value, of a combination of the first transistor and the second transistor, varies at a second rate with the change in the temperature of the current source, wherein the second rate is based on the first rate,
the current source comprises an input and a variable resistance,
the current source is configured to (i) for a first scan of the current source, receive a first reference voltage at the input of the current source, and (ii) output a first current in response to the first reference voltage,
the current source is configured to (i) for a second scan of the current source, receive a second reference voltage at the input of the current source instead of the first reference voltage, and (ii) output a second current in response to the second reference voltage, and
the variable resistance is configured to, for a predetermined temperature of the current source, be adjusted from a first resistance to a second resistance to match the second current to the first current.

2. The apparatus of claim 1, wherein:
the current source comprises a first device having an impedance;
the impedance varies proportionally with the change in the temperature; and
the first device is connected in series with the variable resistance.

3. The apparatus of claim 2, wherein:
the first device is a bipolar junction transistor; and
the variable resistance is connected to a emitter of the bipolar junction transistor.

4. The apparatus of claim 1, wherein the variable resistance can be digitally tuned.

5. The apparatus of claim 2, wherein the current source comprises:
a voltage regulator connected to the variable resistance;
a third transistor connected in series with the first device and the variable resistance, wherein the third transistor comprises a control input, and wherein the control input is configured to receive an output of the voltage regulator; and
a fourth transistor connected in series with the first transistor and the second transistor, wherein the fourth transistor comprises a control input, and wherein the control input of the fourth transistor is configured to receive the output of the voltage regulator.

6. The apparatus of claim 5, wherein:
the output current of the current source varies with a change in a reference voltage supplied to the current source; and
resistance of the variable resistance is set based on the reference voltage supplied to the current source.

7. The apparatus of claim 5, wherein voltage regulator comprises:
a first input configured to receive the first reference voltage or the second reference voltage; and
a second input connected to (i) a drain of the third transistor, and (ii) the variable resistance.

8. The apparatus of claim 1, wherein the first transistor comprises a p-type metal-oxide-semiconductor field-effect transistor and the second transistor comprises a n-type metal-oxide-semiconductor field-effect transistor.

9. The apparatus of claim 6, wherein:
the output current of the current source varies linearly with the change in the temperature at the first rate; and
the transconductance value varies linearly with the change in the temperature.

10. The apparatus of claim 1, wherein the buffer is configured to (i) isolate the output current of the current source from a circuit, and (ii) provide an output voltage to the circuit.

11. The apparatus of claim 1, wherein:
the first scan of the current source is conducted over a first range of temperatures and for the first reference voltage;

the second scan of the current source is conducted over a second range of temperatures and for the second reference voltage; and the first range of temperatures and the second range of temperatures comprise the predetermined temperature.

12. The apparatus of claim 1, wherein:

the first scan of the current source is conducted for a first temperature and over a plurality of reference voltages; and the second scan of the current source is conducted for a second temperature and over the plurality of reference voltages.

13. A method comprising:

supplying a reference voltage to a current source, wherein the current source generates an output current, and wherein the output current varies at a first rate and proportionally with a change in a temperature;

recording an output current of the current source while the current source is at a predetermined temperature and while the reference voltage is at a first voltage;

changing the reference voltage from the first voltage to a second voltage; and tuning a variable resistance of the current source to match (i) an output current of the current source generated while the temperature of the current source is at the predetermined temperature and while the reference voltage is at the second voltage to (ii) the output current of the current source generated while the temperature of the current source was at the predetermined temperature and while the reference voltage was at the first voltage.

14. The method of claim 13, further comprising, during a simulated operation of the current source, setting the reference voltage to the first voltage or the second voltage.

15. The method of claim 13, further comprising, based on previous measurements of the output current, setting the reference voltage to the first voltage or the second voltage.

16. The method of claim 13, further comprising:

measuring a transconductance of transistors in the current source; and in response to the transconductance of the transistors in the current source, adjusting the reference voltage to the second voltage, wherein, while the reference voltage is at the second voltage, the transconductance of the transistors in the current source remains constant with changes in the temperature of the current source.

17. The method of claim 13, further comprising:

setting the reference voltage the first voltage or the second voltage; and based on whether the reference voltage is set at the second voltage, tuning the variable resistance in the current source.

18. The method of claim 13, further comprising:

while the current source is receiving the first voltage, establishing a first current versus temperature relationship by recording output currents of the current source for a first range of temperatures, wherein the first current versus temperature relationship has a corresponding first slope;

while the current source is receiving the second voltage, establishing a second current versus temperature relationship by recording output currents of the current source for a second range of temperatures, wherein the second current versus temperature relationship has a corresponding second slope;

based on the first slope and the second slope, determining whether the second current versus temperature relationship provides less variance in a transconductance than the first current versus temperature relationship, wherein the transconductance is of transistors in the current source; and selecting the second voltage in response to determining the second current versus temperature relationship provides less variance in a transconductance than the first current versus temperature relationship.

19. The method of claim 13, further comprising:

during a first scan and while the current source is receiving the first voltage, recording output currents of the current source for a plurality of temperatures;

during a second scan and while the current source is receiving the second voltage, recording output currents of the current source for the plurality of temperatures; and tuning the variable resistance based on results of the first scan and the second scan.

20. The method of claim 13, wherein:

during a first scan and while the current source is at a first temperature, recording output currents of the current source for a plurality of reference voltages;

during a second scan and while the current source is at a second temperature, recording output currents of the current source for the plurality of reference voltages; and tuning the variable resistance based on results of the first scan and the second scan.

21. The method of claim 13, further comprising:

analyzing current versus temperature relationships for a plurality of voltage reference values; and selecting a reference voltage based on results of the analyzing of the current versus temperature relationships; and supplying the selected reference voltage to the current source to maintain a transconductance at a constant value, wherein the transconductance is of transistors in the current source.

22. The method of claim 21, wherein:

each of the current versus temperature relationships has a corresponding slope; and the selected reference voltage corresponds to the current versus temperature relationship having a slope with a minimum corresponding variance in the transconductance.

* * * * *